US012805379B2

(12) United States Patent
Nuotio

(10) Patent No.: US 12,805,379 B2
(45) Date of Patent: Nov. 17, 2026

(54) ELECTRIC POWER MODULE

(71) Applicant: PIERBURG GMBH, Neuss (DE)

(72) Inventor: Mika Nuotio, San Jose, CA (US)

(73) Assignee: PIERBURG GMBH, Neuss (DE)

(*) Notice: Subject to any disclaimer, the term of this patent is extended or adjusted under 35 U.S.C. 154(b) by 923 days.

(21) Appl. No.: 17/800,226

(22) PCT Filed: Feb. 19, 2020

(86) PCT No.: PCT/US2020/018713

§ 371 (c)(1),
(2) Date: Aug. 17, 2022

(87) PCT Pub. No.: WO2021/167596

PCT Pub. Date: Aug. 26, 2021

(65) Prior Publication Data

US 2023/0068223 A1 Mar. 2, 2023

(51) Int. Cl.
*H10W 76/138* (2026.01)
*H10W 20/41* (2026.01)
(Continued)

(52) U.S. Cl.
CPC ....... *H10W 76/138* (2026.01); *H10W 20/425* (2026.01); *H10W 40/22* (2026.01);
(Continued)

(58) Field of Classification Search
CPC . H01L 23/051; H01L 23/3107; H01L 23/367; H01L 23/49503; H01L 23/53238;
(Continued)

(56) References Cited

U.S. PATENT DOCUMENTS

| | | | |
|---|---|---|---|
| 5,182,632 | A | 1/1993 | Bechtel et al. |
| 5,532,512 | A | 7/1996 | Fillion et al. |

(Continued)

FOREIGN PATENT DOCUMENTS

| | | | |
|---|---|---|---|
| CN | 110491868 | A | 11/2019 |
| JP | 2001-308263 | A | 11/2001 |

(Continued)

*Primary Examiner* — Zandra V Smith
*Assistant Examiner* — Corbyn D Mellinger
(74) *Attorney, Agent, or Firm* — Norman B. Thot

(57) ABSTRACT

An integrated semiconductor power transistor package includes a half-bridge electrical circuit with a negative voltage outer terminal of a high-side switch connected in series with a positive voltage outer terminal of a low-side switch, a first and a second substrate, and vertical spacers. The high and the low side switches include semiconductor power transistor dies connected electrically parallel. The first substrate has a cladding layer sinter bonded to one of the semiconductor power transistor dies to define the low-side power switch. The second substrate has a first cladding layer sinter bonded to one of the semiconductor power transistor dies to define the high-side power switch, and a second cladding layer. Vertical spacers sinter bond the semiconductor power transistor die on the first substrate to the second cladding layer. Vertical spacers also sinter bond the semiconductor power transistor die on the second substrate to the cladding layer.

6 Claims, 8 Drawing Sheets

(51) Int. Cl.

| | |
|---|---|
| ***H10W 40/22*** | (2026.01) |
| ***H10W 70/40*** | (2026.01) |
| ***H10W 70/60*** | (2026.01) |
| ***H10W 74/10*** | (2026.01) |
| ***H10W 90/00*** | (2026.01) |

(52) U.S. Cl.
CPC ........ *H10W 70/411* (2026.01); *H10W 70/611* (2026.01); *H10W 74/111* (2026.01); *H10W 90/00* (2026.01); *H10W 90/401* (2026.01)

(58) Field of Classification Search
CPC ... H01L 23/5385; H01L 25/072; H01L 23/16; H01L 2224/0603; H01L 2224/33181; H01L 2224/73265; H01L 25/18; H01L 23/3735; H02M 3/003; H02M 7/003; H02M 1/088; H02M 1/327; H02M 1/08
See application file for complete search history.

(56) References Cited

U.S. PATENT DOCUMENTS

| | | | | |
|---|---|---|---|---|
| 6,056,186 | A | 5/2000 | Dickson et al. | |
| 10,141,254 | B1 | 11/2018 | Xu et al. | |
| 2014/0225162 | A1 | 8/2014 | Briere | |
| 2020/0051785 | A1* | 2/2020 | Miller | H03K 3/53 |
| 2020/0053900 | A1* | 2/2020 | Feurtado | H05K 5/0069 |
| 2021/0057372 | A1* | 2/2021 | Oh | H01L 25/50 |

FOREIGN PATENT DOCUMENTS

| | | | |
|---|---|---|---|
| JP | 2011-114176 | A | 6/2011 |
| JP | 2015-149842 | A | 8/2015 |
| WO | WO 2016/125673 | A1 | 8/2016 |
| WO | WO 2019/182216 | A1 | 9/2019 |

* cited by examiner

ELECTRIC POWER MODULE

CROSS REFERENCE TO PRIOR APPLICATIONS

This application is a U.S. National Phase application under 35 U.S.C. § 371 of International Application No. PCT/US2020/018713, filed on Feb. 19, 2020. The International Application was published in English on Aug. 26, 2021 as WO 2021/167596 A1 under PCT Article 21(2).

FIELD

The present invention relates to high power density packaging of a plurality of semiconductor power transistors in a dual side cooled package configuration with reduced thermal resistance, improved gate control signal integrity, lower material cost, and fewer required production process steps.

BACKGROUND

Semiconductor power transistors packaged in a half-bridge circuit configuration are commonly used to realize direct current (DC) to alternating current (AC) power inverter circuits, AC to DC power converter circuits, and DC to DC power converter circuits. Semiconductor power transistors used in such power conversion circuits dissipate heat. Conducting the dissipated heat out of the package in an efficient manner is important to maximize the power such semiconductor power transistors can process, while minimizing the size and cost of the semiconductor power transistor package.

Minimizing the thermal resistance between the semiconductor power transistor die and the package heat sinks can be achieved by reducing the number of material layers and material bonding layers between the semiconductor power transistor die and the package heat sinks. Reducing the number of material and material bond layers further minimizes the number of required production process steps, resulting in a lower cost package.

Improvements in semiconductor power transistor technologies have resulted in very fast transistor switching speeds on the order of tens of amperes within a few nanoseconds. Parasitic source inductances of semiconductor power transistor packages in conjunction with fast switching current transients results in transient voltage spikes opposing the controlling gate signal, which, if not mitigated, can result in significant switching performance degradation and in some cases device failures.

Solder bonds between semiconductor power transistor dies and substrates are generally limiting the package reliability when subjected to thermal cycling induced stresses. Using alternative bonding methods with improved thermal cycling durability is desirable to improve the overall package reliability.

Stray inductances within semiconductor power transistor packages and connections to external circuits can cause overvoltage transients during fast transistor switching events. Such overvoltage transients can cause the semiconductor power transistors to fail if not mitigated. While the transistor switching speed can be reduced to suppress such overvoltage transients by increasing gate resistances, such reduction of transistor switching speed increases switching losses, which is not desirable.

Paralleling multiple semiconductor power transistors can cause resonant oscillations of the gate signals to the parallel driven transistors. Such oscillations, if not mitigated, can result in large variations in dynamic current sharing and junction temperature variations between the parallel transistors leading to loss of performance and possible device failures.

SUMMARY

An aspect of the present invention is to provide embodiments to solve one or more of the above problems. The present disclosure, which includes improvements to packaging and cooling of semiconductor power transistors, describes embodiments that allow the power semiconductor switches to operate at optimal performance, power density and cost.

In an embodiment, the present invention provides an integrated semiconductor power transistor package which includes a half-bridge electrical circuit comprising a negative voltage outer terminal of a high-side switch which is connected in series with a positive voltage outer terminal of a low-side switch, a first substrate, a second substrate, a first plurality of vertical spacers, a second plurality of vertical spacers, and an encapsulant. Each of the high side switch and the low-side switch comprises a plurality semiconductor power transistor dies which are connected electrically parallel. The first substrate comprises a cladding layer which is sinter bonded to at least a first one of the plurality of semiconductor power transistor dies so as to define the low-side power switch. The second substrate is arranged parallel to the first substrate. The second substrate comprises a first cladding layer which is sinter bonded to at least a second one of the plurality of semiconductor power transistor dies so as to define the high-side power switch, and a second cladding layer. The first plurality of vertical spacers sinter bonds the at least the first one of the plurality of semiconductor power transistor dies which defines the low-side power switch on the first substrate to the second cladding layer of the second substrate. The second plurality of vertical spacers sinter bonds the at least the second one of the plurality of semiconductor power transistor dies which defines the high-side power switch on the second substrate to the cladding layer of the first substrate. The encapsulant encapsulates at least a cavity between the first substrate and the second substrate.

BRIEF DESCRIPTION OF THE DRAWINGS

The present invention is described in greater detail below on the basis of embodiments and of the drawings in which.

DETAILED DESCRIPTION

Figure 1:
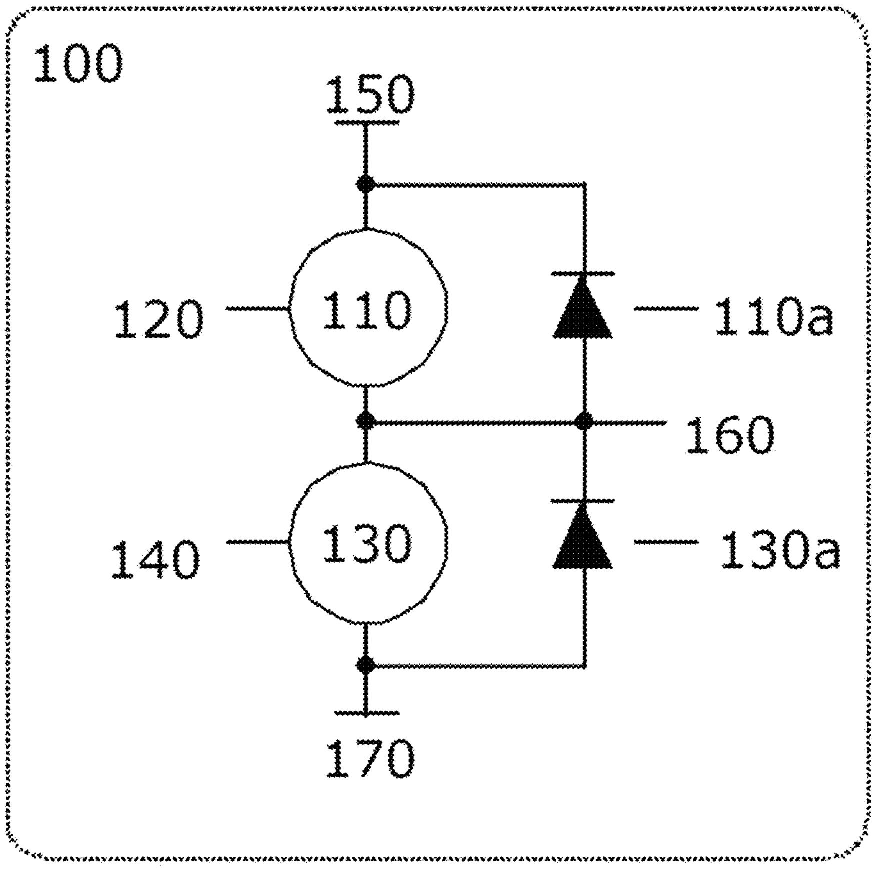
FIG. 1 illustrates an exemplary half-bridge electrical circuit according to certain embodiments of the present invention.

Embodiments of the present invention and their advantages are best understood by referring to the detailed description that follows. It should thereby be appreciated that in the drawings like reference numerals are used to identify like elements, wherein showings therein are only for purposes of illustrating embodiments of the present invention and not for purposes of limiting the scope of protection of the present invention.

The present invention relates to packaging of semiconductor power transistors and apparatus and methods used to maximize power density while minimizing the thermal resistance between the packaged transistors and external heat sinks.

The present invention, which describes improvements to packaging and cooling structures, describe embodiments that allow the packaged semiconductor power transistors to be more efficient, to be more reliable, to have a higher power density, and to be more cost effective.

FIG. 1 schematically illustrates a half-bridge electrical configuration 100 of two power switches of the present invention. In certain embodiments, each of the two half-bridge power switches 110 and 130 may comprise one or more parallel connected semiconductor power transistors. The positive power terminal of the transistors defining the high-side power switch 110 are electrically connected to the positive voltage outer terminal 150, and the negative voltage power terminal 170 of the transistors defining the power switch 110 are electrically connected to the mid-point terminal 160. The positive power terminals of the transistors defining the low-side power switch 130 are electrically connected to the mid-point terminal 160, and the negative power terminals of the transistors defining the low side power switch 130 are electrically connected to the negative voltage outer terminal 170. The Semiconductor power transistors defining power switches 110 and 130 are controlled through their respective gate control signal parts 120 and 140.

In certain embodiments, the package may include diode structures 110*a* and 130*a* comprising a plurality of semiconductor diode dies which are connected in parallel with the high-side power switch 110 and low-side power switch 130, respectively.

Figure 2:
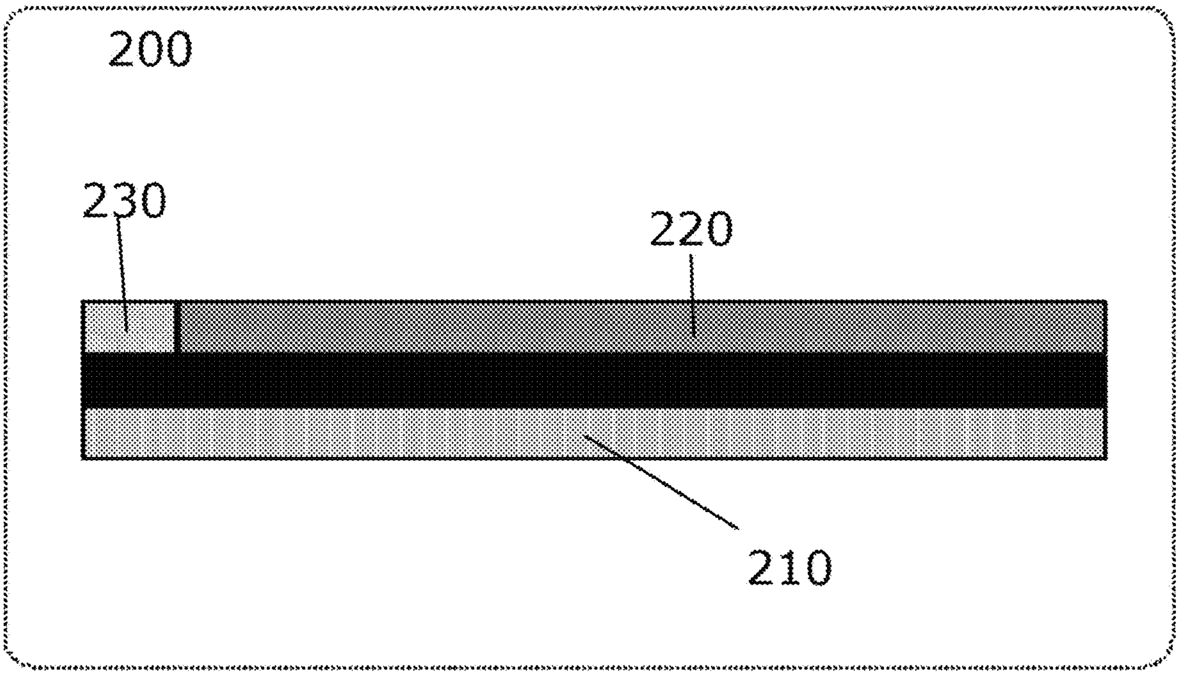
FIG. 2 schematically illustrates a cross section of a semiconductor power transistor die according to certain embodiments of the present invention.

FIG. 2 schematically illustrates a cross section of an exemplary internal structure of a semiconductor power transistor die 200 according to certain embodiments of the present invention. The schematic illustration of the semiconductor power transistor die 200 shows a positive power terminal pad 210, a negative power terminal pad 220, and a transistor gate terminal pad 230. In certain embodiments, the semiconductor power transistor comprises a metal-oxide-semiconductor-field-effect-transistor MOSFET or an insulated-gate-bipolar-transistor IGBT structure. The positive and negative power terminals correspond to the drain and source terminals respectively in a MOSFET transistor structure. The positive and negative power terminals correspond to the collector and emitter terminals, respectively, in an IGBT transistor structure.

In certain embodiments, the MOSFET or IGBT transistor structure may be formed from silicon, silicon carbide, gallium nitride, another III-V semiconductor, or other semiconductor materials.

Certain embodiments of the present inventions can be used to realize direct current (DC) to alternating current (AC) power inverter circuits, AC to DC power converter circuits, and DC to DC power converter circuits. Such power conversion circuits generate heat as a byproduct. Most of this heat is generated by the semiconductor power transistors within the package. Certain embodiments of the present invention provide more efficient and more uniform ways to dissipate heat through both the top and bottom side of the package.

Figure 3:
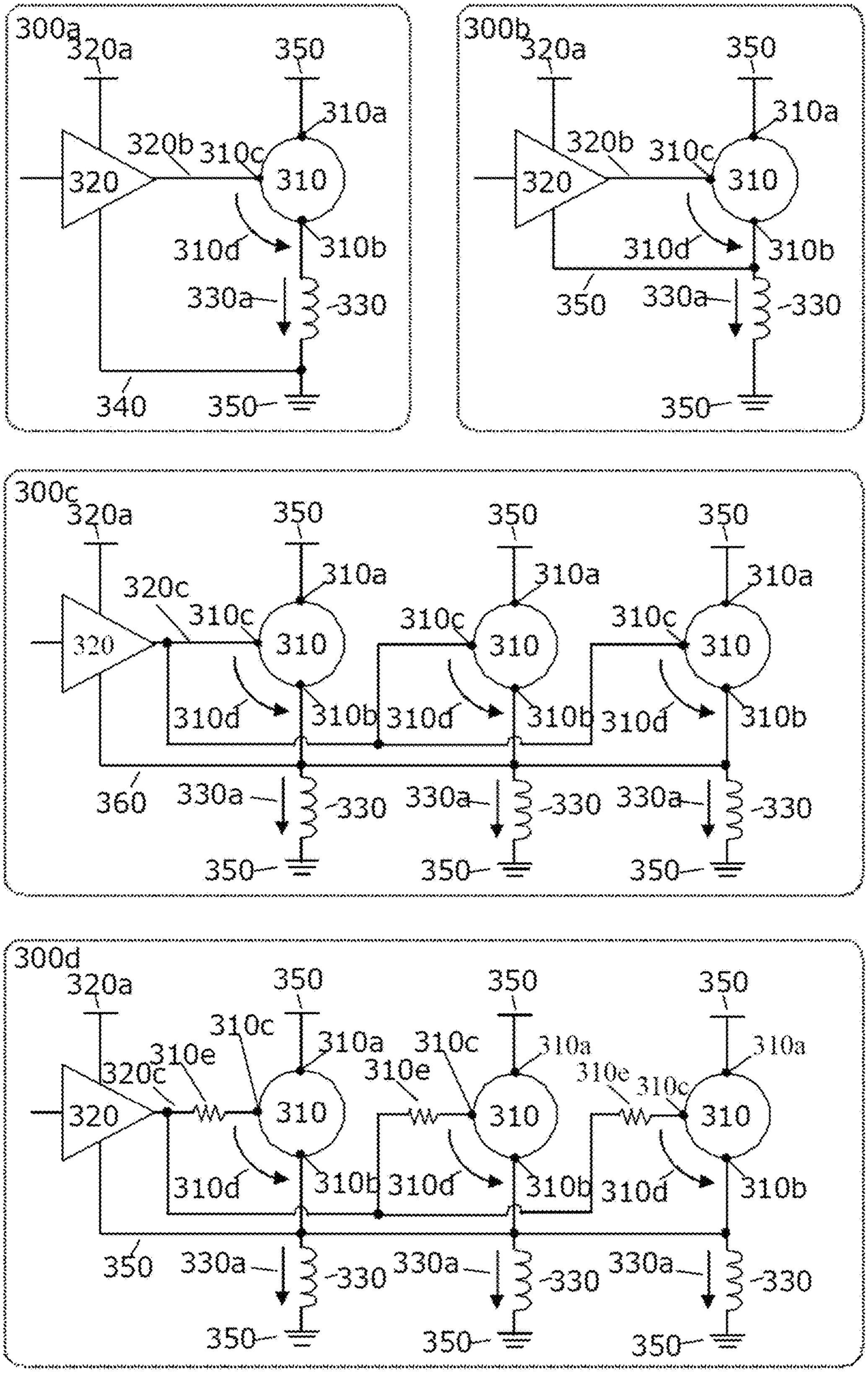
FIG. 3 illustrates exemplary electrical gate drive circuit structures according to certain embodiments of the present invention.

FIG. 3 schematically illustrates various semiconductor power transistors electrical gate drive circuit embodiments of the present invention. Circuit 300*a* schematically illustrates a common gate drive circuit. Gate driver 320 with gate drive supply voltage Vdd 320*a* has a return path electrically connected to a negative potential 350 electrically connected through a series connected parasitic inductance Lp 330 to a negative power terminal 310*b* of a semiconductor power transistor 310. This parasitic inductance 330 is the result of parasitic effects of electrical interconnection structures within the power semiconductor package as well as the circuit of the gate driver 320 external to the power semiconductor package. The gate driver 320 controls the semiconductor power transistor 310 by imposing a gate control signal 320*b* to the gate terminal 310*c* of the semiconductor power transistor. The semiconductor power transistor 310 is turned on when the voltage between the semiconductor power transistor 310 gate terminal 310*c* and negative power terminal 310*b* Vgn 310*d* is above a certain device specific voltage threshold. Likewise, the semiconductor power transistor 310 is turned off when Vgn 310*d* is below a certain device specific threshold. The gate control voltage Vgn 310*d* is further influenced by the parasitic inductance Lp 330 and the rate at which current changes (di/dt) during transistor turn on and turn off transients. The gate control voltage Vgn 310*d* is opposed by the voltage across the parasitic inductance Vind 330*a*. The effective gate control voltage Vgn 310*d* can be expressed as:

$$Vgn = Vdd - Vind = Vdd - Lp \times \frac{di}{dt}$$

To mitigate the influence of parasitic inductance Lp 330 on the gate control voltage Vgn 310*d*, an alternate circuit 300*b* having a Kelvin gate return signal 350 is directly connected to the negative power terminal of the power semiconductor power transistor. Certain exemplary embodiments of the present invention include package interconnect structures that electrically implement Kelvin gate return signals 350. An exemplary embodiment 300*c* of the present invention implements structures to realize a common gate control signal 320*c* for a plurality of parallel connected semiconductor power transistor dies 200. Circuit 300*c* schematically exemplarily illustrates three parallel connected semiconductor power transistor dies 200. Another exemplary embodiment 300*d* of the present invention includes package interconnect structures and resistive elements 310*e* electrically connected in series with each of the plurality of parallel connected semiconductor power transistor dies. An advantage of the present invention is that resistive elements 310*e* in series with each individual semiconductor power transistor die 200 dampen voltage ripple on the gate control signal 320*c* caused by resonant oscillations between gate control signal terminations for such parallel connected semiconductor power transistor dies 200.

Figure 4:
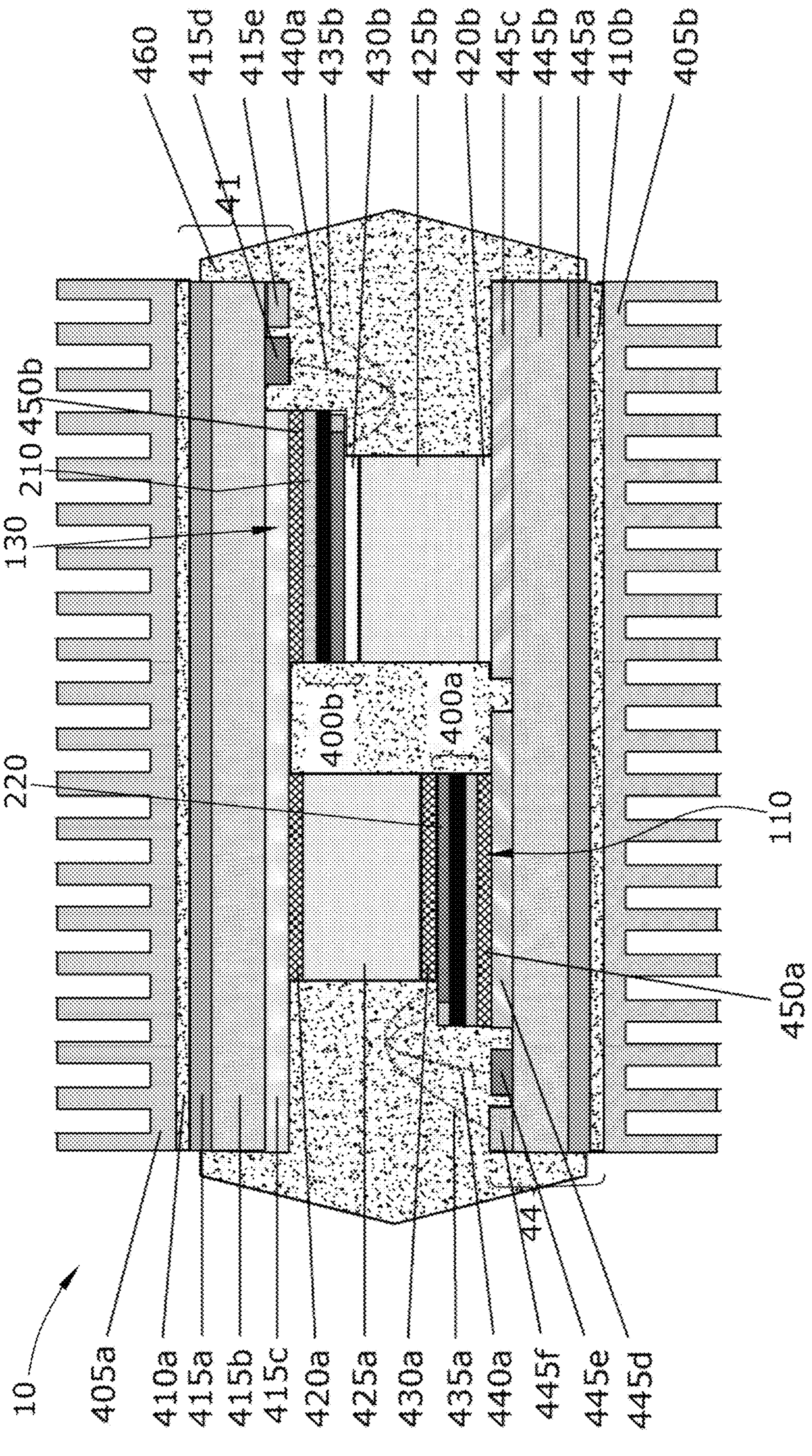
FIG. 4 illustrates a cross section of an exemplary dual side cooled packaging structure according to certain embodiments of the present invention.

FIG. 4 schematically illustrates a cross section of an internal structure of an exemplary half-bridge semiconductor power transistor package according to certain embodiments of the present invention. One instance of a semiconductor power transistor die 400*a* implements a high-side power switch 110. A second instance of a semiconductor power transistor die 400*b* implements a low-side power switch 130. The package 10 comprises a first substrate 41 having an exemplary external copper cladding layer 415*a* and exemplary internal copper cladding layers 415*c*, 415*d* and 415*e*, whereas the external and internal cladding layers are electrically isolated by a substrate core material 415*b*. The package 10 further comprises an exemplary second substrate 44 having an exemplary external copper cladding layer 445*a* and exemplary internal copper cladding layers 445*c*, 445*d*, 445*e* and 445*f*, where the external and internal cladding layers are electrically isolated by a substrate core material 445*b*. In certain exemplary embodiments, such first and second substrates 41, 44 may be a direct-bonded-copper (DBC) substrate, an active-metal-braze (AMB) substrate, or a direct-plated-copper (DPC) substrate.

The positive power terminal pad 210 of the second instance low-side power transistor die 400*b* is directly bonded electrically and thermally through bonding layer 450*b* to the cladding layer 415*c* of the first substrate 41, where such cladding layer 415*c* forms a mid-point terminal electrical connection 160. The negative power terminal pad 220 of the low-side power transistor die 400*b* is bonded electrically and thermally through a vertical spacer 425*b* and bonding layers 430*b*, 420*b* to the cladding layer 445*c*, where the cladding layer 445*c* forms a negative voltage outer terminal electrical connection 170.

The positive power terminal pad 210 of the high-side power transistor die 400*a* is directly bonded electrically and thermally through a bonding layer 450*a* to a cladding layer 445*d* of the second substrate, wherein the cladding layer 445*d* forms a positive voltage outer terminal electrical connection 150. The negative power terminal pad 220 of the high-side power transistor die 400*a* is bonded electrically and thermally through a vertical spacer 425*a* and the bonding layers 430*a*, 420*a* to a cladding layer 415*c*, where the cladding layer 415*c* forms a mid-point terminal electrical connection 160.

In certain exemplary embodiments, the bonding layers 420*a*, 430*a*, 450*a*, 420*b*, 430*b*, and 450*b* are realized by means of sintering bonds. Sintering bonds may be formed using paste or film comprising silver, copper, platinum, palladium, gold particles, microparticles, or nanoparticles. Advantages of sintering bonds of the present disclosure compared with soldering bonds are substantial reduction in thermal cycling fatigue resulting in improved durability of bonding layers and reduction of thermal resistance resulting in improved cooling performance.

In certain embodiments the spacers 425*a*, 425*b* may be made from electrically and thermally conducting metal alloys, including copper alloys, Si filled AlMg alloys, or other alloys having requisite thermal and electrical conductivities.

In certain exemplary embodiments, wire bonding structures define electrical connections between the transistor gate terminal pad 230 of the transistor die 400*b* and the cladding layer 415*e* defining a gate control signal 320*b* interconnect structure and between the negative power terminal pad 220 of the transistor die 400*b* and the copper cladding layer 415*d* together defining a Kelvin gate return signal interconnect structure. Exemplary wire bonding structures correspondingly make electrical connections between the transistor gate terminal pad 230 and the negative power terminal pad 220 of the transistor 400*a* to the respective copper clad layers 445*f* and 445*e* on the second substrate forming gate control 320*b* and Kelvin return signal interconnect structures. In other embodiments, gate and power terminal pads 220, 230 of transistors 400*a*, 400*b* may be wire bonded to a lead frame pin or a lead frame pin may be directly bonded to the transistor gate terminal pad 230 and to the power terminal pad 220 without bond wires.

Heat generated by transistor 400*a* is partially spread and transferred through the bonding layers 450*a*, the inner copper clad layer 445*e*, the substrate core 445*b*, the external copper clad layer 445*a*, the heatsink bonding layer 410*b*, and is dissipated through an exemplary external heat sink 405*b*. Heat generated by transistor 400*a* is further partially spread and transferred through the bonding layer 430*a*, the spacer 425*a*, the bonding layer 420*a*, the inner copper clad layer 415*c*, the substrate core material 415*b*, the external copper clad layer 415*a*, the heatsink bonding layer 410*a*, and is dissipated through an exemplary external heat sink 405*a*. The thermal resistance from the transistor die 400*a* to the heatsink 405*b* is proportionally lower than the thermal resistance from the die 400*a* to the heatsink 405*a*. The proportionally higher thermal resistance from the die 400*a* to the heatsink 405*a* is caused by additional thermal resistances introduced by the spacer 425*a* and the bonding layer 420*a* as well as the cross-section area of the spacer 425*a* being smaller than the total area of die 400*a*. As a result of the inverted, complementary structure of the present invention, the die 400*b* has a proportionally lower thermal resistance to heatsink 405*a* than thermal resistance from the die 400*b* to the heatsink 405*b*. This complementary thermal resistance relationship results in lower concentration of heat flux and more uniform cooling performance on both heatsinks, allowing closer horizontal spacing of the dies 400*a* and 400*b*, enabling a reduced size and cost dual side cooled package for the same thermal performance. An advantage of the present invention is the reduced number of material layers and material bonding layers between the transistors 400*a*, 400*b* to the external heat sinks 405*a*, 405*b*.

In certain exemplary embodiments, the heatsinks 405*a*, 405*b* may be air cooled. In other exemplary embodiments, the heatsinks 405*a*, 405*b* may be liquid cooled. In some exemplary embodiments, the heatsinks 405*a*, 405*b* may be flat plates, finned plates, plates with microchannels, or having other microstructures. In some embodiments, the heatsinks 405*a*, 405*b* may be constructed from copper alloys, aluminum alloys, or other metallic alloys.

The heatsink bonding layers 410*a*, 410*b* may in some exemplary embodiments be formed by soldering. In certain embodiments, the bonding layers 410*a*, 410*b* may be sinter formed using paste or film comprising silver, copper, platinum, palladium, or gold particles, microparticles, or nanoparticles. In other embodiments, the bonding layers 410*a*, 410*b* may be formed by thermally conductive adhesives. In other embodiments, the bonding layers 410*a*, 410*b* may be formed by thermal interface materials including thermal pastes and thermal pads.

The encapsulant 460 encases at least the cavity formed between the first and second substrates. An advantage of the present invention is that the encapsulant 460 provides mechanical structural support, protection against moisture and pollutant ingress, and electrical isolation of the power semiconductor transistors and package internal interconnect structures. In some exemplary embodiments, the encapsulant 460 may comprise a polymer such as an epoxy resin, polyester, polyurethane, or other plastics.

Figure 5:
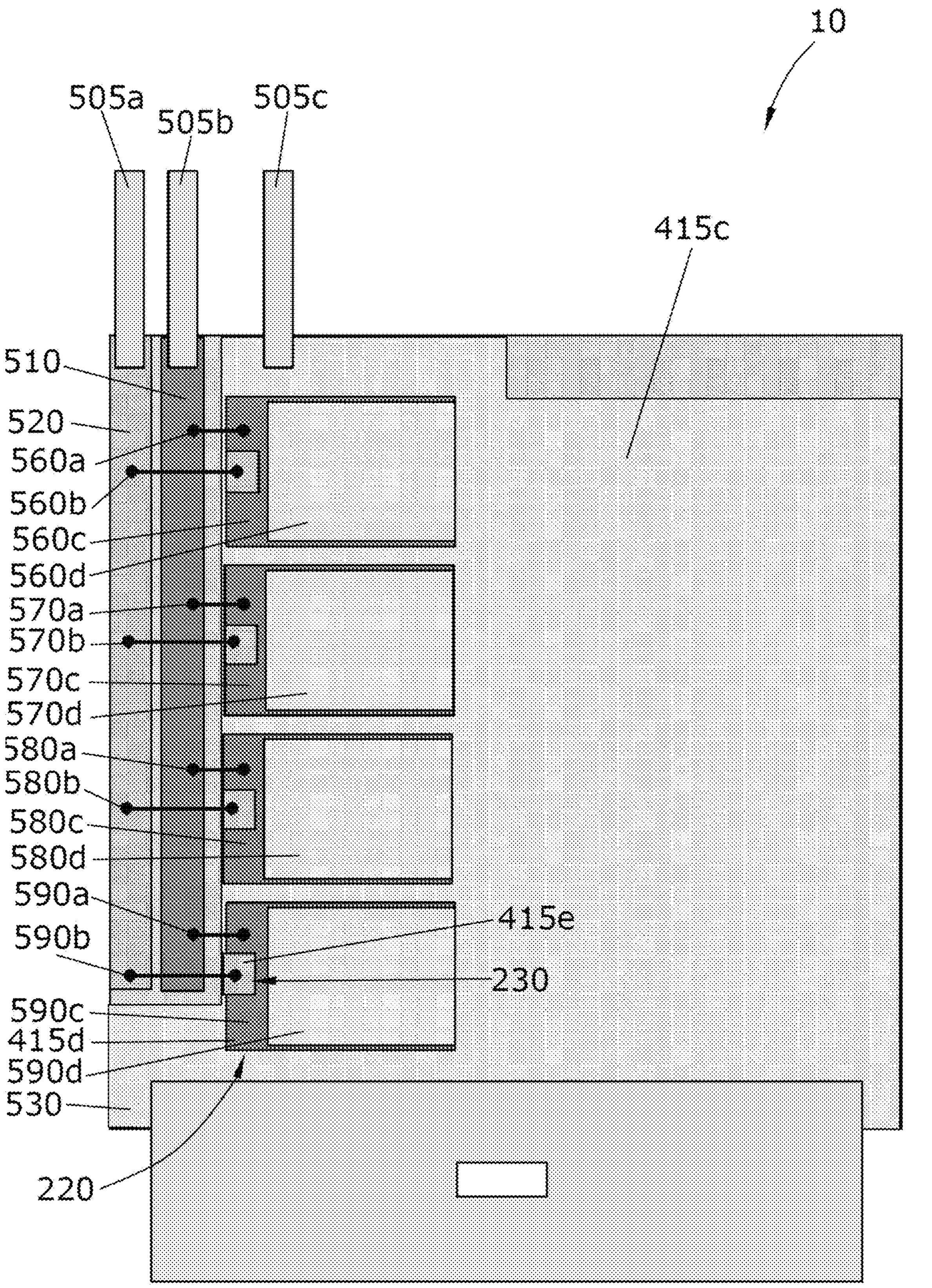
FIG. 5 illustrates an exemplary structure of the first substrate sub-assembly according to certain embodiments of the present invention.

FIG. 5 illustrates a top view of an embodiment comprising an exemplary first substrate sub-assembly. The embodiment illustrates an exemplary embodiment of a low-side power switch 130 comprising four parallel connected power semiconductor transistor dies 200.

An exemplary gate control signal 320*c* interconnect structure comprises a copper lead frame pin 505*a* bonded to a copper cladding layer shape 520, which is further separately bonded by a wire 560*b*, 570*b*, 580*b*, 590*b* to gate terminal pads 230 for each individual semiconductor power transistor die 200.

An exemplary Kelvin gate interconnect structure for a Kelvin gate return signal 360 comprises a copper lead frame pin 505*b* bonded to a copper cladding layer shape 510, which is further separately bonded by a wire 560*a*, 570*a*, 580*a*, 590*a* to the negative power terminal pads 220 for each individual semiconductor power transistor die instance.

The semiconductor power transistor die negative power terminals 220 are schematically illustrated as 560*c*, 570*c*, 580*c*, and 590*c*.

The top surface of the spacer 425*b* bonded to the negative power terminal pad of each semiconductor power transistor die instance are illustrated by reference numerals 560*d*, 570*d*, 580*d*, and 590*d*.

An exemplary interconnect structure of a mid-point terminal 160 comprises a power lead frame pin 505*d* bonded to a copper cladding layer shape 530, which is further bonded to the positive power terminal pad of each semiconductor power transistor die instance. An advantage of the present invention is large contiguous surface area of copper cladding layer 530, which minimizes impedance resulting in lower thermal conduction losses, minimizes stray inductance between transistor die in the high-side power switch 110 and the low-side power switch 130 improving the switching performance, and further improves the structural rigidity of the package.

In another exemplary embodiment of the present invention, copper lead frame pin 505*c* bonded to copper cladding layer 530 provide an external electrical sensing connection to the mid-point terminal 160 for implementation of external overcurrent detection circuits.

Figure 6:
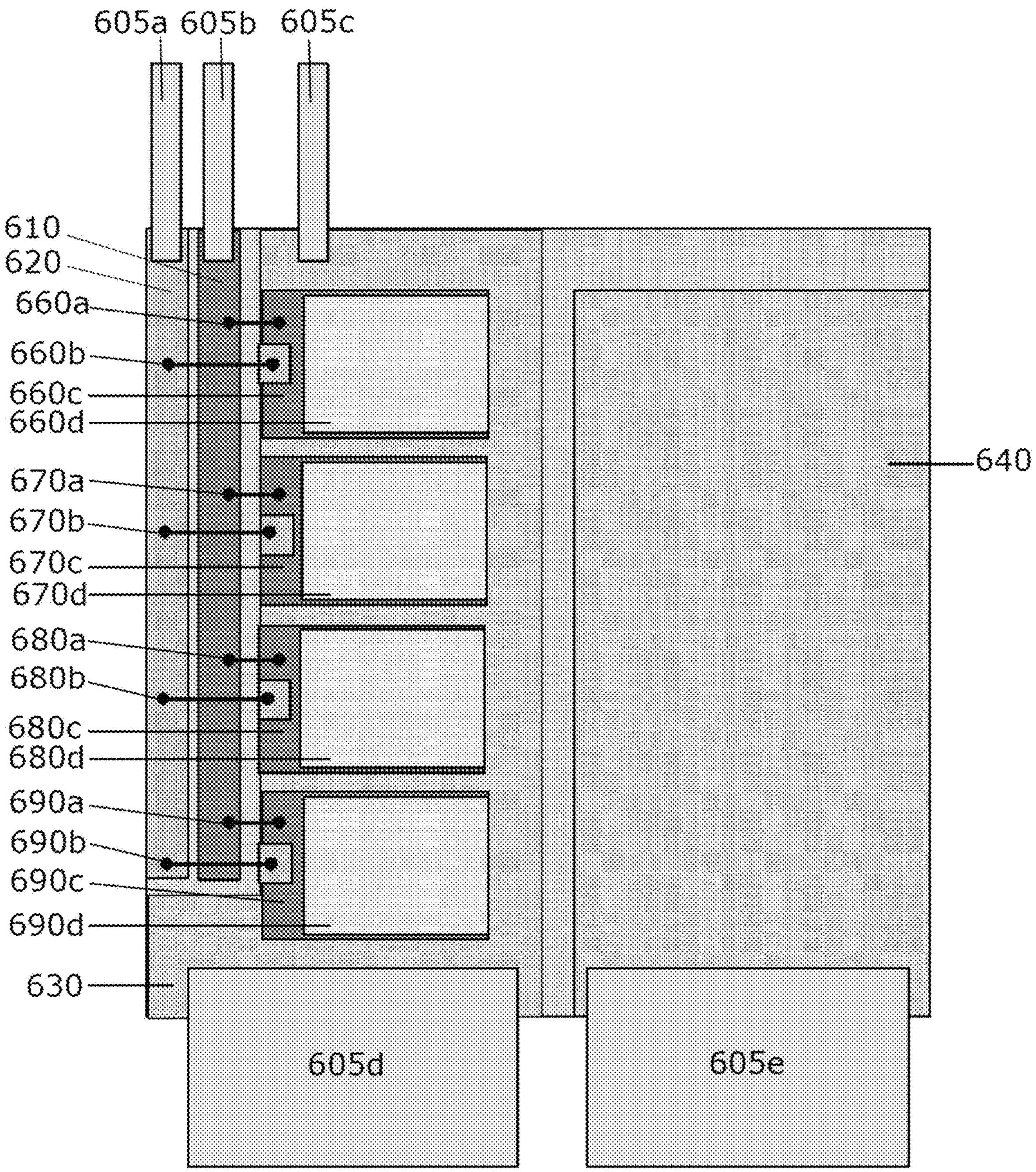
FIG. 6 illustrates an exemplary structure of the second substrate sub-assembly according to certain embodiments of the present invention.

FIG. 6 illustrates a top view of an embodiment comprising an exemplary second substrate sub-assembly. The embodiment illustrates an exemplary embodiment of a high-side power switch 110 comprising four parallel connected power semiconductor transistor die's 200.

An exemplary interconnect structure of a gate control signal 320*c* comprises a copper lead frame pin 605*a* bonded to a copper cladding layer shape 620, which is further separately bonded by a wire 660*b*, 670*b*, 680*b*, and 690*b* to the transistor gate terminal pads 230 for each individual semiconductor power transistor die 200.

An exemplary interconnect structure of a Kelvin gate return signal 360 comprises a copper lead frame pin 605*b* bonded to copper cladding layer shape 610, which is further separately bonded by a wire 660*a*, 670*a*, 680*a*, and 690*a* to negative power terminal pads 220 for each individual semiconductor power transistor die instance.

The semiconductor power transistor negative power terminals are schematically illustrated as 660*c*, 670*c*, 680*c*, and 690*c*.

The top surface of spacer 425*a* bonded to the negative power terminal pad of each semiconductor power transistor die instance are illustrated by 660*d*, 670*d*, 680*d*, and 690*d*.

An exemplary interconnect structure of a positive voltage outer terminal 150 comprises a power lead frame pin 605*d* bonded to a copper cladding layer shape 630. An exemplary negative voltage outer terminal 170 interconnect structure comprises a power lead frame pin 605*e* bonded to a copper cladding layer shape 640, which is further bonded to the positive power terminal pad of each individual semiconductor power transistor die instance. An advantage of the structure of the present invention is the close parallel proximity of the copper cladding layers 630 and 640 corresponding to the positive voltage outer terminal 150 and the negative voltage outer terminal 170 of the half-bridge electrical circuit configuration 100. This parallel proximity suppresses parasitic loop inductance across positive voltage outer terminal 150 and the negative voltage outer terminal 170, which reduces switching transient voltage overshoot amplitudes.

Exemplary embodiment copper lead frame pin 605*c* bonded to copper cladding layer shape 630 provides an external electrical sensing connection to the positive voltage outer terminal for implementation of external overcurrent detection circuits.

An advantage of the present invention is realized by having one of the power lead frame pins 505*d* bonded to the first substrate and the other two power lead frame pins 605*d* and 605*e* bonded to the second substrate. The width of power lead frame pins and number of power lead frame pins in the same plane drive the overall width of the package. The overall width of the package can be reduced by separating the three power lead frames in two parallel planes, one plane per substrate. The cost of two lead frames doubles the copper lead frame material cost. In comparison, the material cost of each substrate is more than 30 times higher per unit area than the material cost of each copper lead frame. A reduction of package width allowed by the present invention improves overall power density and reduces overall material cost.

Figure 7:
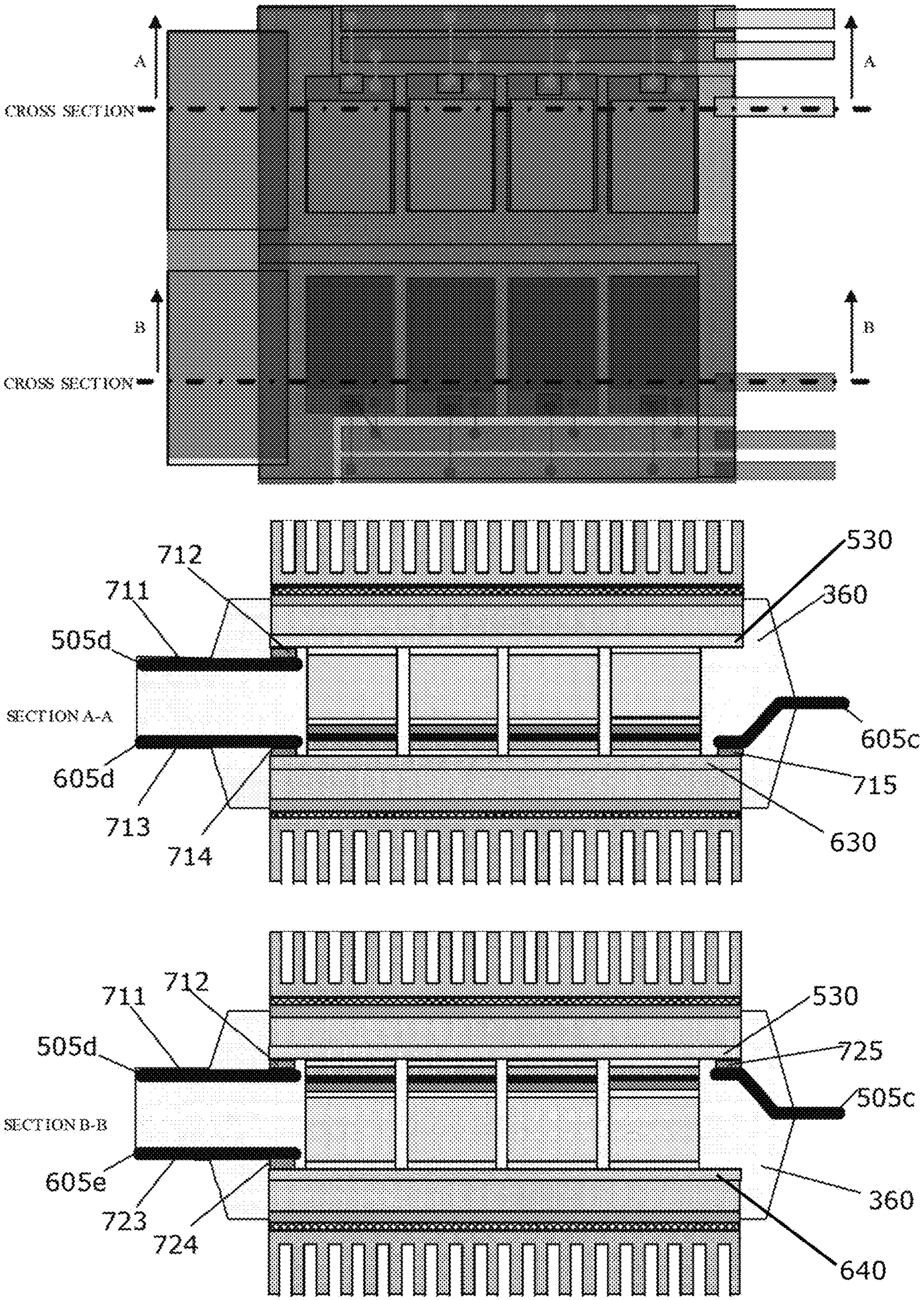
FIG. 7 illustrates exemplary side view cross sections of the packaging structure according to certain embodiments of the present invention.

FIG. 7 illustrates two side view cross sections and for an exemplary embodiment of a package comprising four parallel connected power semiconductor transistor dies for each high-side power switch 110 and low-side power switch 130, respectively.

The plane of cross section cuts through the semiconductor power transistor die 200 comprising the high-side power switch 110. The plane of cross section cuts through the semiconductor power transistor dies 200 comprising the low-side power switch 130.

Exemplary power lead frame pin 505*d* is bonded with a bonding layer 712 to a copper cladding layer shape 530 on the first substrate. Exemplary power lead frame pins 605*d* and 605*e* are bonded with bonding layers 714 and 724, respectively, to copper cladding layer shapes 630, 640 of the second substrate. Exemplary copper lead frame pin 605*c* is bonded through a bonding layer 715 to a copper cladding layer shape 630 on the second substrate. A copper lead frame pin 505*c* is bonded through a bonding layer 725 to the copper cladding layer shape 530 on the first substrate. In certain exemplary embodiments of the present invention, lead frame pin bonding layers 712, 714, 715, 724, and 725 may be formed by soldering, ultrasonic welding, or in certain embodiments, sintering bonds may be formed using paste or film comprising silver, copper, platinum, palladium, or gold particles, microparticles, or nanoparticles.

In one exemplary embodiment of the present invention, the package and lead frame pins are encapsulated by encapsulant 460 except for: the lead frame pins 505*c*, 605*c* extruding beyond the encapsulant, the exposed power lead frame pin surfaces 711, 713, 723, and the external copper clad layers 415*a*, 445*a*. An advantage of the exposed large surface area power lead frame pin surfaces 711, 713, 723 is allowing for the formation of a low-impedance connection to external busbars. One exemplary embodiment of a low-impedance bonding of busbars to power lead frame pin surfaces 711, 713, 723 includes a welding bond. In some exemplary embodiments of the present invention, such welding bonds may be formed using ultrasonic welding, laser welding, or electron-beam welding.

The height of spacers 425*a* and 425*b* is determined by the required minimum electrical clearances between i) inner copper clad layer shapes (415*c*, 415*d*, 415*e*) of the first substrate 41 and inner copper clad layer shapes (445*c*, 445*d*, 445*e*, 445*f*) of the second substrate 42, and ii) the power lead frame pin 505*d* on the first substrate and the power lead frame pins 605*d* and 605*e* on the second substrate. The minimum electrical clearance depends on the maximum operating voltage for the specific application and the voltage withstand properties of the encapsulant 460 material. In one exemplary embodiment, spacers 425*a* and 524*b* have a height of 2.4 mm. The height of the spaces 425*a*, 425*b* will generally be between 1.5 mm and 5.0 mm.

Figure 8:
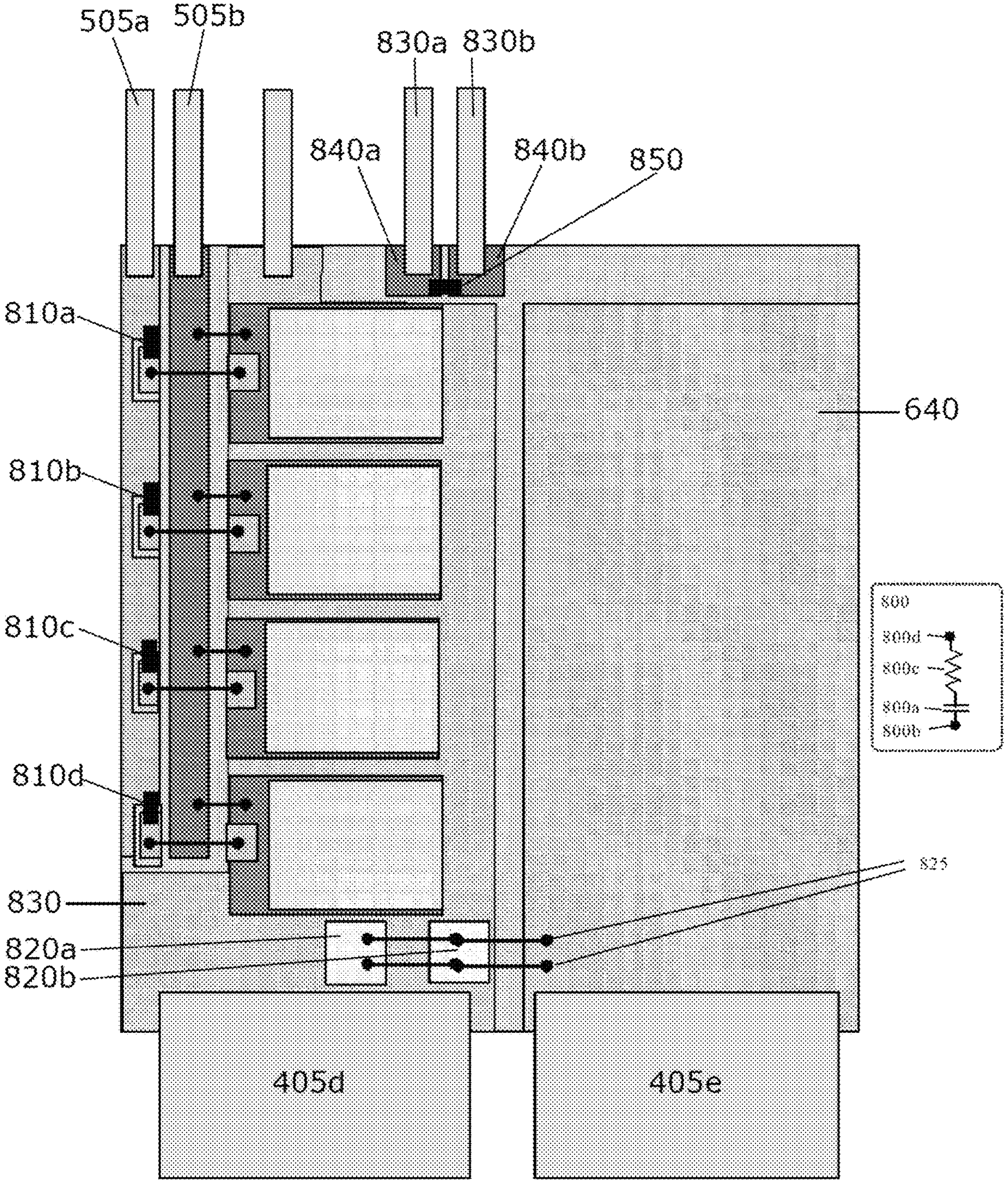
FIG. 8 illustrates a further exemplary structure of the second substrate sub-assembly according to certain embodiments of the present invention.

FIG. 8 illustrates a top view of an embodiment of the present invention comprising an exemplary second substrate sub-assembly. Power lead frame pin 405*d* is here bonded to copper cladding layer shape 830 of the second substrate, and power lead frame pin 405*e* is bonded to copper cladding layer shape 640 of the second substrate. The embodiment illustrates an exemplary embodiment with four parallel connected power semiconductor transistor dies 200 comprising a high-side power switch 110, where individual resistive element instances 810*a*, 810*b*, 810*c*, 810*d* are electrically connected in series between the interconnect structure of the gate control signal 320*c* and the transistor gate terminal pad 230 for each individual semiconductor power transistor die 200 respectively. In one exemplary embodiment, such resistive elements may include surface mount metal film resistors solder bonded to a copper cladding layer.

Another exemplary embodiment of the present invention includes a temperature sensing device 850 having a first terminal bonded to copper cladding layer shape 840*a* being further bonded to a lead frame pin 830*a* and having a second terminal bonded to a copper cladding layer shape 840*b* being further bonded to a lead frame pin 830*b*. In other exemplary embodiments, the first terminal may be sinter bonder to copper cladding layer shape 840*a* and the second terminal may be wire bonded to copper cladding layer shape 840*b*. In certain exemplary embodiments, such temperature sensing device 850 may be a thermistor, thermocouple, or resistance-temperature-detector (RTD). Such temperature sensing device 850 can be used by external circuitry to monitor the package internal temperature for diagnostics, thermal power curtailing control, or thermal shutdown control.

Certain exemplary embodiments of the present invention may further comprise exemplary energy absorbing snubber devices 800 used to suppress transient voltage oscillations induced by switching of the semiconductor power transistor dies 200. Energy absorbing snubber devices are electrically connected between the positive voltage outer terminal 150 and the negative voltage outer terminal 170. An exemplary embodiment of a snubber device may be a resistive-capacitive (RC) snubber device 800 comprising a capacitor 800*a* and resistor 800*c* connected in series implemented as a semiconductor die having its bottom surface corresponding to its outer capacitor terminal 800*b* and its top surface corresponding to its outer resistor terminal 800*d*. In certain exemplary embodiments of the present invention, a plurality of such snubber dies 820*a* and 820*b* is provided, each die having its respective terminal 800*b* solder or sinter bonded to a copper clad layer shape 630, and terminal 800*d* bonded to a copper cladding layer shape 640 using a plurality of bond wires 825. Advantages of the energy absorbing snubber device 800 in the present invention include reduced voltage stresses on the semiconductor power transistors and reduced high frequency voltage oscillations.

In the foregoing specifications, the disclosure has been described with reference to specific embodiments. However, as one skilled in the art will appreciate, various embodiments disclosed herein can be modified or otherwise implemented in various other ways without departing from the spirit and scope of the disclosure. This description is accordingly to be considered as illustrative and is for the purpose of teaching those skilled in the art the manner making and using various embodiments of the disclosed invention. It is to be understood that the forms of disclosure herein shown and described are to be takes as representative embodiments. Equivalent elements, materials, processes or steps may be substituted for those representatively illustrated and described herein. Certain features of the disclosure may moreover be utilized independently of the use of other features, all as would be apparent to one skilled in the art after having the benefit of this description of the disclosure.

As used herein, the terms "comprises", "comprising", "includes", "including", "has", "having" or any contextual variants thereof, are intended to cover a non-exclusive inclusion. For example, a process, product, article, or apparatus that comprises a list of elements is not necessarily limited to only those elements but may include other elements not expressly listed or inherent to such process, product, article, or apparatus. Further, unless expressly stated to the contrary, "or" refers to an inclusive or and not to an exclusive or. For example, a condition "A or B" is satisfied by any of the following: A is true (or present) and B is false (or not present), A is false (or not present) and B is true (or present), and both A and B is true (or present).

It will also be appreciated that one or more of the elements depicted in the drawings/figures can also be implemented in a more separated or integrated manner, or even removed or rendered as inoperable in certain cases, as is useful in accordance with a particular application. Reference should also be had to the appended claims.

LIST OF REFERENCE NUMERALS

10 Package
41 First substrate
44 Second substrate
100 Half-bridge electrical configuration
110 Half-bridge power switch/High side power switch
110*a* Diode structure
120 Gate control signal part
130 Half-bridge power switch/Low-side power switch
130*a* Diode structure
140 Gate control signal part
150 Positive voltage outer terminal/Positive voltage outer terminal connection
160 Mid-point terminal/Mid-point terminal electrical connection
170 Negative voltage outer terminal/Negative voltage outer terminal electrical connection

200 Semiconductor power transistor die
210 Positive power terminal pad
220 Negative power terminal pad
230 Transistor gate terminal pad
300*a-c* Circuit
310 Semiconductor power transistor
310*b* Negative power terminal
310*c* Gate terminal
310*d* Gate control voltage
320 Gate driver
320*a* Gate drive supply voltage
320*b-c* Gate control signal
330, 330*a* Parasitic inductance
350 Kelvin gate return signal/Negative potential
360 Kelvin gate return signal
400*a-b* Semiconductor power transistor die
405*a-b* Heatsink
410*a-b* Heatsink bonding layer
415*a* External copper cladding layer
415*b* Substrate core material
415*c-e* Internal copper cladding layers
420*a-b* Bonding layer
425*a-b* Vertical spacer/Spacer
430*a-b* Bonding layer
445*a* External copper cladding layer
445*b* Substrate core material
445*c-f* Internal copper cladding layer
450*a-b* Bonding layer
460 Encapsulant
505*a-c* Copper lead frame pin
505*d* Power lead frame pin
510 Copper cladding layer shape
520 Copper cladding layer shape
530 Copper cladding layer shape
560*a-b* Wire
560*c-d* Negative power terminal
570*a-b* Wire
570*c-d* Negative power terminal
580*a-b* Wire
580*c-d* Negative power terminal
590*a-b* Wire
590*c-d* Negative power terminal
605*a-c* Copper lead frame pin
610 Copper cladding layer shape
620 Copper cladding layer shape
630 Copper cladding layer shape
640 Copper cladding layer shape
660*a-b* Wire
660*c-d* Negative power terminal
670*a-b* Wire
670*c-d* Negative power terminal
680*a-b* Wire
680*c-d* Negative power terminal
690*a-b* Wire
690*c-d* Negative power terminal
711 Power lead frame pin surfaces
712 Bonding layer
713 Power lead frame pin surfaces
714 Bonding layer
715 Bonding layer
723 Power lead frame pin surfaces
724 Bonding layer
725 Bonding layer
800 Snubber device
800*a* Capacitor
800*b* Outer capacitor terminal
800*c* Resistor

800*d* Outer resistor terminal
810*a-d* Resistive element instances
820*a-b* Snubber die
825 Bond wire
830*a-b* Lead frame pin
840*a-b* Copper cladding layer shape
850 Temperature sensing device

What is claimed is:

1. An integrated semiconductor power transistor package comprising:

a half-bridge electrical circuit comprising a negative voltage outer terminal of a high-side power switch which is connected in series with a positive voltage outer terminal of a low-side power switch, each of the high-side power switch and the low-side power switch comprising a plurality of semiconductor power transistor dies which are connected electrically parallel;

a first substrate comprising a mid-point terminal copper cladding layer shape which is sinter bonded to at least a positive power terminal pad of a first one of the plurality of semiconductor power transistor dies so as to define the low-side power switch, and a copper cladding layer shape;

a second substrate which is arranged parallel to the first substrate, the second substrate comprising a first positive voltage outer terminal copper cladding layer which is sinter bonded to at least a positive power terminal pad of a second one of the plurality of semiconductor power transistor dies so as to define the high-side power switch, a copper cladding layer shape, and a negative voltage outer terminal copper cladding layer;

a first plurality of vertical spacers which are sinter bonded to a negative power terminal pad of the at least the first one of the plurality of semiconductor power transistor dies which defines the low-side power switch on the first substrate and to the negative voltage outer terminal copper cladding layer of the second substrate;

a second plurality of vertical spacers which are sinter bonded to a negative power terminal pad of the at least the second one of the plurality of semiconductor power transistor dies which defines the high-side power switch on the second substrate and to the mid-point terminal copper cladding layer shape of the first substrate;

a positive voltage outer terminal power lead frame pin which is bonded to a mid-point terminal copper cladding layer shape of the second substrate;

a negative voltage outer terminal power lead frame pin which is bonded to the copper cladding layer shape of the second substrate;

a mid-point voltage outer terminal lead frame pin which is bonded to the copper cladding layer shape of the first substrate, wherein, the positive voltage outer terminal power lead frame is arranged adjacent to the negative voltage outer terminal power lead frame pin, and at least one of the positive voltage outer terminal power lead frame pin and the negative voltage outer terminal power lead frame pin is/are at least partially overlapped by the mid-point voltage outer terminal lead frame pin; and an encapsulant which encapsulates at least a cavity between the first substrate and the second substrate and a cavity between the positive voltage outer terminal power lead frame pin, the negative voltage outer terminal power lead frame pin, and the mid-point voltage outer terminal lead frame pin.

2. The integrated semiconductor power transistor package as recited in claim 1, further comprising:

a negative power terminal pad for each of the plurality of semiconductor power transistor dies;

a lead frame pin; and an electrical interconnect structure which forms a Kelvin gate return signal path between the negative power terminal pad for each of the plurality of semiconductor power transistor dies and the lead frame pin.

3. The integrated semiconductor power transistor package as recited in claim 1, further comprising:

at least one lead frame pin which is bonded to the copper cladding layer shape of the first substrate; and at least one lead frame pin which is bonded to the copper cladding layer shape of the second substrate.

4. The integrated semiconductor power transistor package as recited in claim 1, wherein, the first substrate further comprises an external cladding layer, the second substrate further comprises an external cladding layer, and the integrated semiconductor power transistor package further comprises:

at least one first heat sink which is bonded to the external cladding layer of the first substrate; and at least one second heat sink which is bonded to the external cladding layer of the second substrate.

5. The integrated semiconductor power transistor package as recited in claim 1, wherein, each of the plurality of semiconductor power transistor dies comprises a gate terminal and a lead frame pin, the integrated semiconductor power transistor package further comprises:

a plurality of electric resistors which are connected in series between the lead frame pin and the gate terminal pad of each of the plurality of semiconductor power transistor dies; and an interconnect structure which forms an electrical path with at least one of the plurality of electric resistors.

6. The integrated semiconductor power transistor package as recited in claim 1, further comprising:

at least one energy absorbing snubber die which comprises a terminal; and an interconnect structure which forms an electrical connection between the terminal of the at least one energy absorbing snubber and the positive voltage outer terminal and the negative voltage outer terminal of the half-bridge electrical circuit.

* * * * *